(12) United States Patent
Leonard, III et al.

(10) Patent No.: US 10,854,429 B2
(45) Date of Patent: Dec. 1, 2020

(54) PLASMA REACTORS HAVING RECUPERATORS

(71) Applicant: ReCarbon, Inc., Santa Clara, CA (US)

(72) Inventors: George Stephen Leonard, III, Oakland, CA (US); Stefan Andrew McClelland, San Jose, CA (US); Jae Mo Koo, Palo Alto, CA (US)

(73) Assignee: RECARBON, INC., Santa Clara, CA (US)

( * ) Notice: Subject to any disclaimer, the term of this patent is extended or adjusted under 35 U.S.C. 154(b) by 0 days.

(21) Appl. No.: 16/805,670

(22) Filed: Feb. 28, 2020

(65) Prior Publication Data
US 2020/0312638 A1    Oct. 1, 2020

Related U.S. Application Data

(60) Provisional application No. 62/823,436, filed on Mar. 25, 2019, provisional application No. 62/823,492,
(Continued)

(51) Int. Cl.
*H01J 37/32* (2006.01)
*C23C 16/511* (2006.01)
(Continued)

(52) U.S. Cl.
CPC ......... *H01J 37/32229* (2013.01); *B01J 19/12* (2013.01); *C23C 16/511* (2013.01); *G01J 1/0425* (2013.01); *G01J 1/0492* (2013.01); *G01J 1/429* (2013.01); *G01J 1/4228* (2013.01); *H01J 37/32449* (2013.01); *H01J 37/32623* (2013.01); *H01J 37/32844* (2013.01); *H01J 37/32972* (2013.01); *H05H 1/46* (2013.01);
(Continued)

(58) Field of Classification Search
CPC ........... H01J 37/32201; H01J 37/32192; H01J 37/32357; H01J 37/32449
USPC ...................................... 315/111.21
See application file for complete search history.

(56) References Cited

U.S. PATENT DOCUMENTS 6,211,622 B1 * 4/2001 Ryoji ................ H01J 37/32009
118/723 HC
6,320,321 B2 * 11/2001 Ogura ..................... H01J 27/18
118/723 MW
(Continued)

FOREIGN PATENT DOCUMENTS

| KR | 10-0522167 B1 | 10/2005 |
|----|----|----|
| KR | 10-2012-0011481 A | 2/2012 |
| KR | 10-2017-0006007 A | 1/2017 |

*Primary Examiner* — Tung X Le
(74) *Attorney, Agent, or Firm* — Patent Office of Dr. Chung Park

(57) ABSTRACT

A plasma generating system includes a waveguide for transmitting a microwave energy therethrough and an inner wall disposed within the waveguide to define a plasma cavity, where a plasma is generated within the plasma cavity using the microwave energy. The plasma generating system further includes: an adaptor having a gas outlet through which an exhaust gas processed by the plasma exits the plasma cavity; and a recuperator directly attached to the adaptor and having a gas passageway that is in fluid communication with the gas outlet in the adaptor. The recuperator recovers heat energy from the exhaust gas and heats an input gas using the heat energy.

20 Claims, 10 Drawing Sheets

Related U.S. Application Data filed on Mar. 25, 2019, provisional application No. 62/823,505, filed on Mar. 25, 2019, provisional application No. 62/823,508, filed on Mar. 25, 2019, provisional application No. 62/823,514, filed on Mar. 25, 2019, provisional application No. 62/823,517, filed on Mar. 25, 2019, provisional application No. 62/823,484, filed on Mar. 25, 2019.

(51) Int. Cl.
    *H05H 1/46* (2006.01)
    *G01J 1/04* (2006.01)
    *G01J 1/42* (2006.01)
    *B01J 19/12* (2006.01)

(52) U.S. Cl.
    CPC ... *H01J 37/32192* (2013.01); *H01J 37/32513* (2013.01); *H01J 2237/1502* (2013.01); *H05H 2001/469* (2013.01); *H05H 2001/4622* (2013.01)

(56) References Cited

U.S. PATENT DOCUMENTS

| | | | |
|---|---|---|---|
| 6,340,863 B1* | 1/2002 | Ikeda | H05H 1/24 315/111.21 |
| 7,469,654 B2* | 12/2008 | Ishibashi | H01J 37/32192 118/723 MW |
| 8,171,880 B2* | 5/2012 | Nishimoto | H01J 37/32192 118/723 MW |
| 8,633,648 B2 | 1/2014 | Tanibata et al. | |
| 9,699,880 B2 | 7/2017 | Lee et al. | |
| 2004/0069232 A1* | 4/2004 | Huang | H01J 37/32229 118/723 MW |
| 2006/0266637 A1 | 11/2006 | Gutsol | |
| 2007/0062645 A1* | 3/2007 | Fukuchi | C30B 33/04 156/345.24 |
| 2008/0277265 A1* | 11/2008 | Tsangaris | C01B 3/386 204/157.15 |
| 2013/0121671 A1 | 5/2013 | Lee | |
| 2018/0139834 A1* | 5/2018 | Nagashima | H01J 37/32174 |
| 2020/0025379 A1* | 1/2020 | Jones | F23R 3/005 |

* cited by examiner

PLASMA REACTORS HAVING RECUPERATORS

CROSS-REFERENCE TO PRIOR APPLICATIONS

This application claims priority of U.S. Patent Application Nos. 62/823,436; 62/823,492; 62/823,505; 62/823,508; 62/823,514; 62/823,517; and 62/823,484, which are hereby incorporated by reference in their entirety.

BACKGROUND OF THE INVENTION

1. Field of the Invention

The present invention relates to plasma generators, and more particularly to plasma generators having recuperators for recovering heat from the exhaust gas of the plasma generators.

2. Discussion of the Related Art

In recent years, microwave technology has been applied to generate various types of plasma. For instance, a microwave discharge, which is used as a plasma source, is achieved by coupling microwave energy into a discharge chamber containing gas to be processed. Typically, the gas that is processed/reacted by the plasma and leaves the plasma chamber as the exhaust gas is at an elevated temperature. The conventional plumbing systems for cooling the exhaust gas may suffer from thermal losses due to the unrecovered thermal energy of the exhaust gas.

Also, the conventional cooling systems for cooling the exhaust gas include tubing or piping to connect a plasma reactor to the conventional cooling system, where the tubing need to withstand the thermal and chemical nature of the exhaust gas, potentially oxidizing. Typically, it is at best impractical and expensive to achieve protection from the thermal and chemical damages with exotic coatings on refractory metals or materials. Furthermore, if the thermal energy of the exhaust gas is to be recovered, all heat losses and insulation requirements associated with the tubing or piping would decrease the efficiency of the plasma system; typically, piping heat losses can be quite significant for the conventional flow rates and temperatures for plasma reactor.

As such, there is a need for a compact recuperator to recover heat energy from the exhaust gas and transfer it to the inlet gas to thereby improve the energy efficiency of the plasma system without introducing complicated cooling system design and/or material difficult to work with.

SUMMARY OF THE INVENTION

According to one aspect of the present invention, a plasma generating system includes: a plasma cavity for generating a plasma therewithin; an adaptor having a gas outlet through which an exhaust gas processed by the plasma exits the plasma cavity; and a recuperator directly attached to the adaptor and having a gas passageway that is in fluid communication with the gas outlet in the adaptor, the recuperator being configured to recover heat energy from the exhaust gas and to heat an input gas using the heat energy.

According to one aspect of the present invention, a plasma generating system includes: a waveguide for transmitting a microwave energy therethrough; an inner wall disposed within the waveguide to define a plasma cavity, a plasma being generated within the plasma cavity using the microwave energy, the waveguide having a gas outlet through which an exhaust gas processed by the plasma exits the plasma cavity; a recuperator directly attached to the waveguide and having a gas passageway that is in fluid communication with the gas outlet in the waveguide, the recuperator being configured to recover heat energy from the exhaust gas and to heat an input gas using the heat energy; a gas inlet mounted on the waveguide and configured to receive the input gas from the recuperator and introduce the input gas into the plasma cavity; and a pipe having one end coupled to the recuperator and another end coupled to the gas inlet, wherein the input gas flows from the recuperator to the gas inlet through the pipe.

DETAILED DESCRIPTION OF THE PREFERRED EMBODIMENTS

In the following description, for purposes of explanation, specific details are set forth in order to provide an understanding of the disclosure. It will be apparent, however, to one skilled in the art that the disclosure can be practiced without these details. Furthermore, one skilled in the art will recognize that embodiments of the present disclosure, described below, may be implemented in a variety of ways.

Components, or modules, shown in diagrams are illustrative of exemplary embodiments of the disclosure and are meant to avoid obscuring the disclosure. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components.

Reference in the specification to "one embodiment," "preferred embodiment," "an embodiment," or "embodiments" means that a particular feature, structure, characteristic, or function described in connection with the embodiment is included in at least one embodiment of the disclosure and may be in more than one embodiment. Also, the appearances of the above-noted phrases in various places in the specification are not necessarily all referring to the same embodiment or embodiments.

The use of certain terms in various places in the specification is for illustration and should not be construed as limiting. The terms "include," "including," "comprise," and "comprising" shall be understood to be open terms and any lists the follow are examples and not meant to be limited to the listed items.

Figure 1:
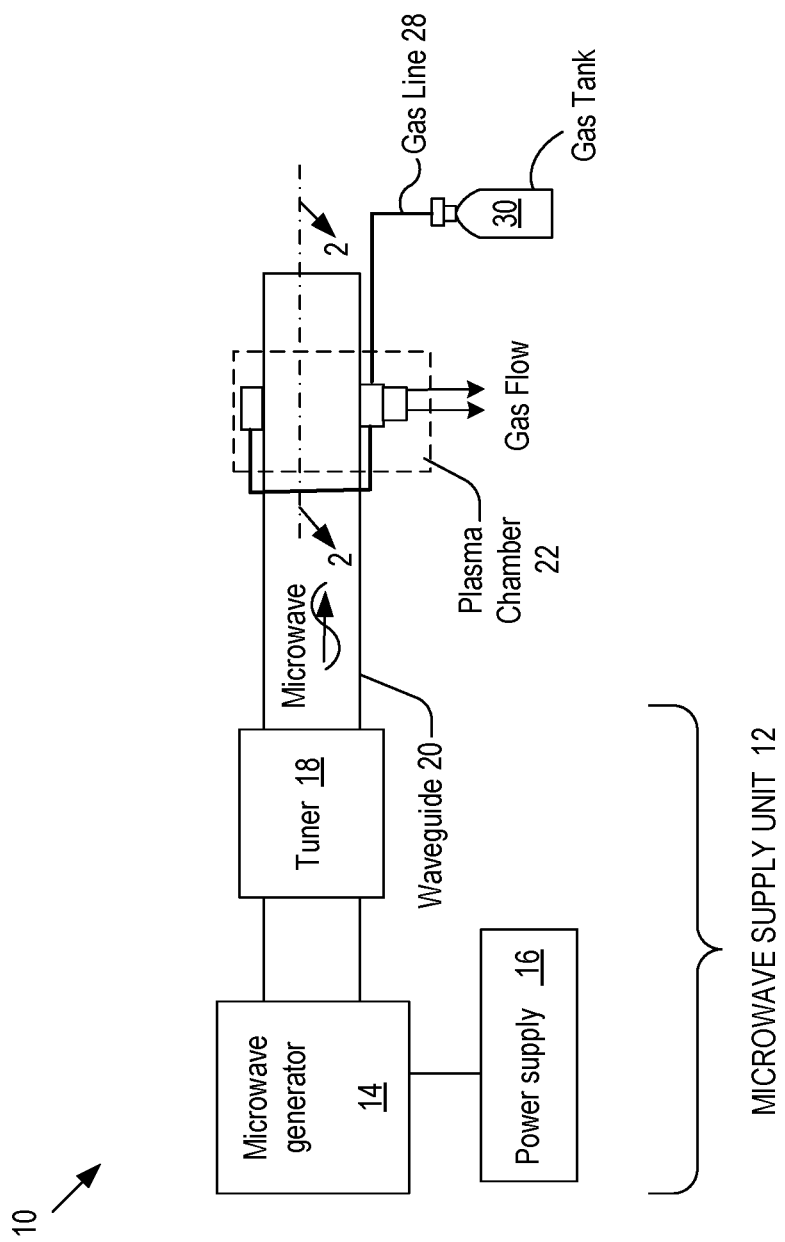
FIG. 1 shows a schematic diagram of a plasma generating system according to embodiments of the present disclosure.

FIG. 1 ("FIG. 1") shows a schematic diagram of a plasma generating system 10 according to embodiments of the present disclosure. As depicted, the plasma generating system 10 includes: a microwave cavity/waveguide 20 having a shape of a hollow tube; a plasma chamber 22 connected to the waveguide 20; and a microwave supply unit 12 connected to the waveguide 20 and operative to provide microwave energy to the plasma chamber 22 via a microwave waveguide 20. In embodiments, the plasma chamber 22 receives the microwave energy and processes gas by use of the received microwave energy. In embodiments, a gas tank 30 provides gas to the plasma chamber 22 via a gas line 28.

The microwave supply unit 12 provides microwave energy to the plasma chamber 22 and includes: a microwave generator 14 for generating microwaves; a power supply 16 for supplying power to the microwave generator 14; and a tuner 18 for reducing the microwave energy reflected from the plasma chamber 22 and travelling toward the microwave generator 14. In embodiments, the microwave supply unit 12 may include other components, such as an isolator having a dummy load for dissipating reflected microwave energy that propagates toward the microwave generator 14 and a circulator for directing the reflected microwave energy to the dummy load and a sliding short circuit disposed at the end of the waveguide 20.

Figure 2:
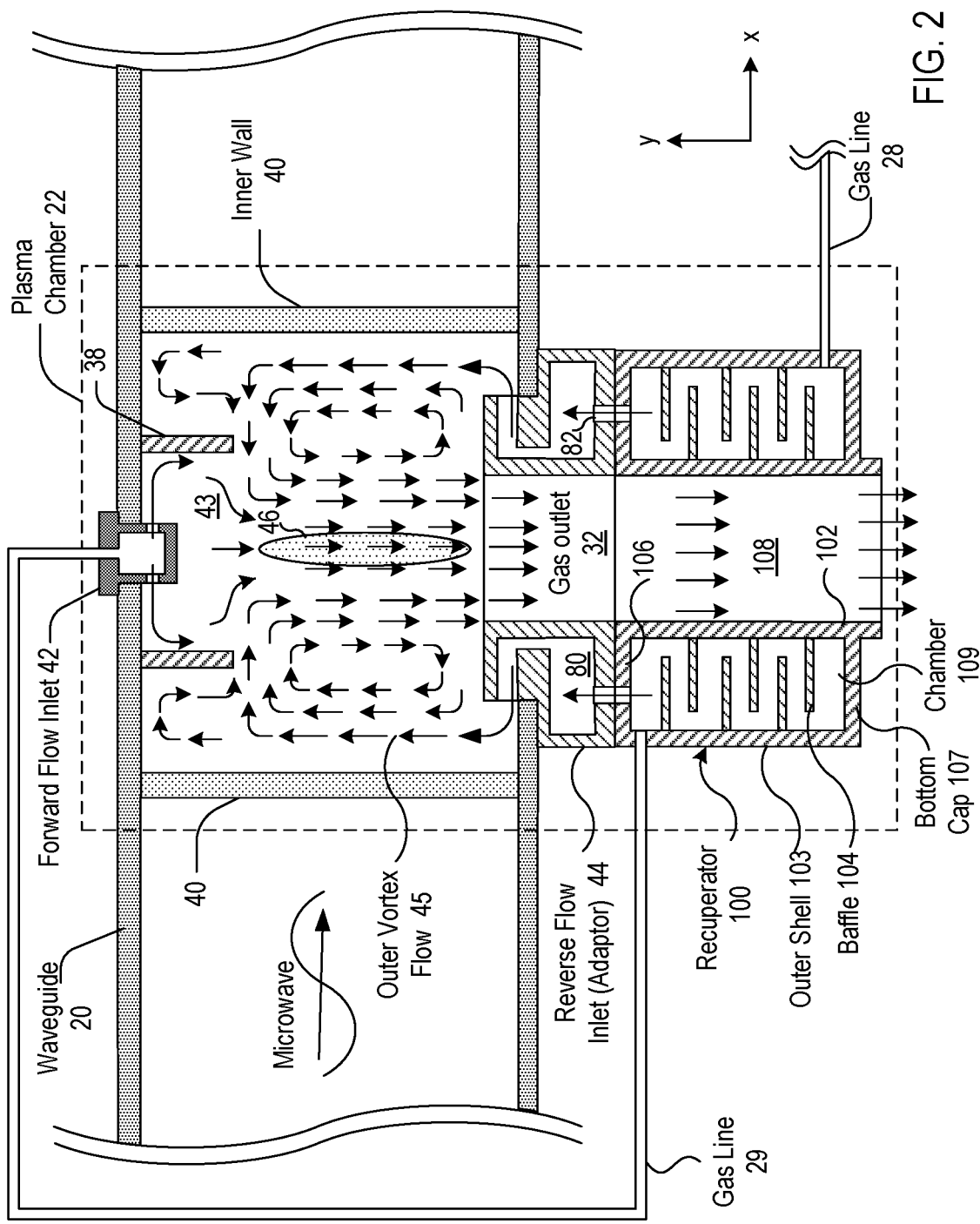
FIG. 2 shows a cross sectional view of a plasma chamber in FIG. 1, taken along the line 2-2, according to embodiments of the present disclosure.

FIG. 2 shows a cross sectional view of a plasma chamber 22 in FIG. 1, taken along the line 2-2 (i.e. cut along a plane parallel to the paper), according to embodiments of the present disclosure. As depicted, the plasma chamber 22 includes: an inner wall(s) 40; a plasma stabilizer 38; a forward flow inlet 42 connected to the gas line 29 and configured to introduce the forward flow into the plasma chamber; a reverse flow inlet (which is also referred to as "adaptor") 44 connected to the gas line 28 and configured to introduce the reverse flow into the plasma chamber; and a recuperator 100 contacting the adaptor 44 and configured to recover heat energy from the exhaust gas. Here, the term plasma cavity refers to the enclosed space that is surrounded by the inner wall 40, waveguide 20, forward flow inlet 42 and adaptor 44, where the reverse flow gas and forward flows are processed/reformed in the plasma cavity by the microwave energy transmitted via the waveguide 20.

In embodiments, the inner wall 40 is formed of a material that is transparent to the microwave energy, such as quartz or ceramic. In embodiments, the inner wall 40 is formed of any other suitable dielectric material that is desirable for uniform flow, thermal resistance, chemical resistance, and electromagnetic transparency. In embodiments, the inner wall 40 has preferably, but not limited to, a shape of hollow circular cylinder.

Figure 3:
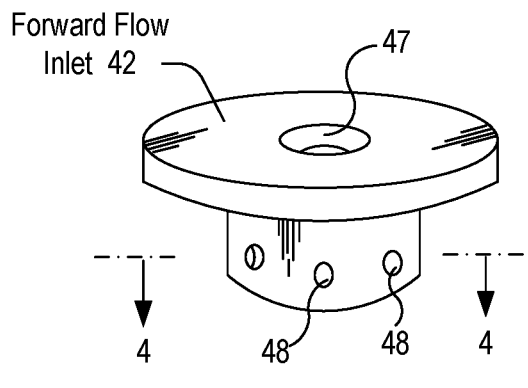
FIG. 3 shows a perspective view of a vortex generator according to embodiments of the present disclosure.
Figure 4:
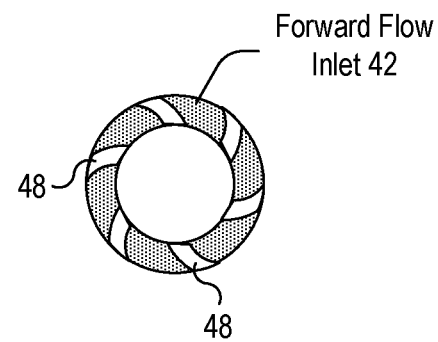
FIG. 4 shows a cross sectional view of the vortex generator in FIG. 3, taken along the line 4-4, according to embodiments of the present disclosure.

FIG. 3 shows a perspective view of the forward flow inlet 42 according to embodiments of the present disclosure. FIG. 4 shows a cross sectional view of the forward flow inlet 42, taken along the line 4-4, according to embodiments of the present disclosure. As depicted, the forward flow inlet 42 has a hole/adaptor 47 for coupling to the gas line 29 and one or more gas passageways 48 that are formed in the wall thereof.

In embodiments, the exits of the gas passageways 48 are located inside the plasma stabilizer 38 so that the plasma stabilizer 38 forms an inner vortex flow 43 using the flow exiting the gas passageways 48. In embodiments, the inner diameter of the plasma stabilizer 38 may be varied to adjust the outer diameter of the inner vortex flow 43. In embodiments, as discussed above, the plasma stabilizer 38 may have a shape of hollow circular cylinder and disposed concentrically to the forward flow inlet 42.

In embodiments, each gas passageway 48 is arranged to impart spiral motion to the forward flow as the forward flow enters the plasma cavity via the gas passageway 48. In embodiments, each gas passageway 48 may be curved to enhance the vorticity of the forward flow. In embodiments, the forward flow inlet 42 is formed of any suitable material, such as ceramic, so that the inlet is electrically isolated from the waveguide 20 and withstand the heat energy from the plasma 46. In embodiments, the forward flow inlet 42 is formed of metal or dielectric material.

Figure 7:
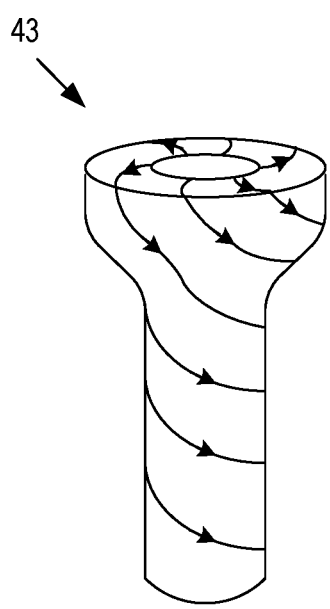
FIG. 7 shows a perspective view of an inner vortex flow according to embodiments of the present disclosure.

In embodiments, the plasma stabilizer 38 is formed of material that is transparent to the microwave energy, and preferably formed of the same material as the inner wall 40. In embodiments, the plasma stabilizer 38 is attached to the waveguide 20, protruding into the plasma cavity, where the axial direction of the plasma stabilizer 38 is parallel to the y-axis. In embodiments, as discussed above, the inner wall 40 may have a shape of a hollow circular cylinder and the plasma stabilizer 38 may be installed concentrically to the inner wall 40. In embodiments, the forward flow inside the plasma stabilizer 38 forms the inner vortex flow 43 and proceeds toward the other end of the waveguide 20, more specifically toward the gas outlet 32. FIG. 7 shows a perspective view of the inner vortex flow 43 according to embodiments of the present disclosure. As depicted, the forward flow (or equivalently, inner vortex flow) travels the length of the inner wall 40 in a helical motion until the inner vortex flow exits the gas outlet 32.

In embodiments, upon ignition of a plasma plume (or shortly, plasma) 46 by a plasma igniter (not shown in FIG. 2), the plasma 46 is sustained by the microwave energy transmitted by the microwave generator 14. The description of exemplary embodiments of the plasma igniter can be found in a copending U.S. Patent Application Ser. No. 16/805,661, entitled "Durable auto-ignition device for plasma reactor," filed on Feb. 28, 2020, which is hereby incorporated by reference in its entirety.

In embodiments, the plasma 46 is located within the inner vortex flow 43 so that the gas particles of the inner vortex flow 43 pass through the plasma 46. In embodiments, the plasma stabilizer 38 determines the outer diameter of the inner vortex flow 43, preventing the forward flow from bypassing the plasma 46 before exiting the plasma cavity through the gas outlet 32. In embodiments, the plasma stabilizer 38 aids in keeping the plasma 46 stable by separating the inner vortex flow 43 from the outer vortex flow 45.

Figure 5:
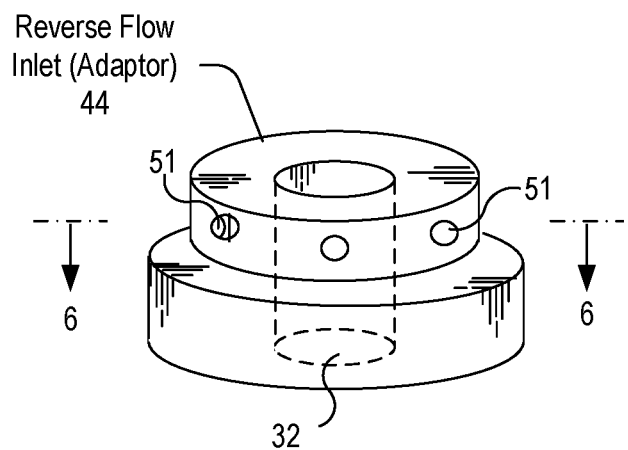
FIG. 5 shows a perspective view of an adaptor according to embodiments of the present disclosure.
Figure 6:
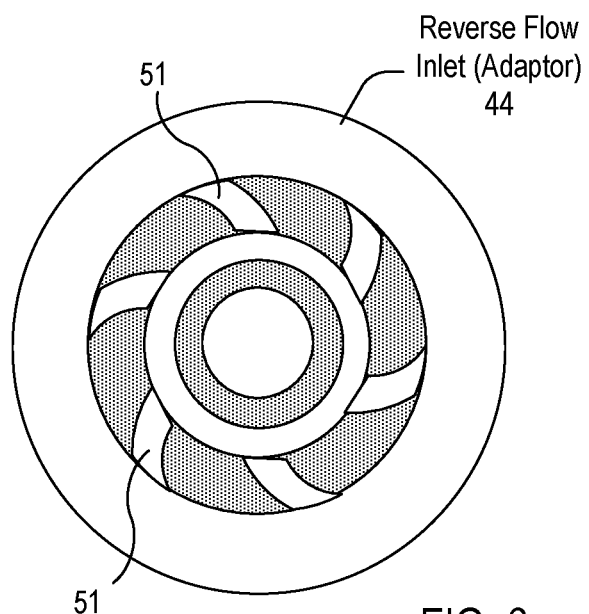
FIG. 6 shows a cross sectional view of the adaptor in FIG. 5, taken along the line 6-6, according to embodiments of the present disclosure.

FIG. 5 shows a perspective view of the adaptor 44 according to embodiments of the present disclosure. FIG. 6 shows a cross sectional view of the adaptor 44, taken along the line 6-6, according to embodiments of the present disclosure. As depicted, the adaptor 44 has: an opening 82 through which the gas from the recuperator 100 flows into the adaptor; a hole to form the gas outlet 32; a stagnation chamber 80; and one or more gas passageways 51 that are formed in the wall thereof. In embodiments, the opening 82 is formed in the bottom wall of the adaptor and is a ring-shaped slit, even though the opening may have other suitable shape.

In embodiments, each gas passageway 51 is arranged to impart spiral motion to the reverse flow as the reverse flow enters the plasma cavity via the gas passageway 51. In embodiments, each gas passageway 51 may be curved to enhance the vorticity of the reverse flow. In embodiments, the adaptor 44 is formed of preferably, but not limited to Ni alloy, such as Inconel or Hastelloy.

Figure 8:
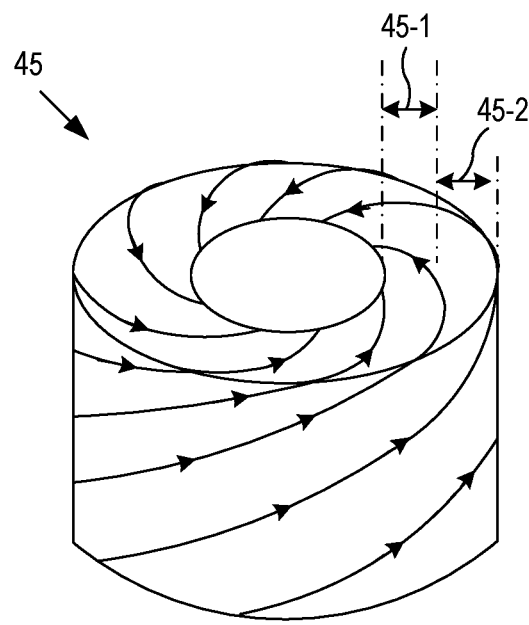
FIG. 8 shows a perspective view of an outer vortex flow according to embodiments of the present disclosure.

In embodiments, the gas flowing through the opening 82 enters the stagnation chamber/space 80. In embodiments, the flow, which is referred to as reverse flow, exits the stagnation chamber 80 and travels toward to the inner wall 40 and then proceeds upwardly (y-axis direction) toward the other end of the waveguide 20 along the inner wall 40 in a helical motion. Subsequently, the reverse flow reverses the flow direction to proceed downwardly and form an outer vortex flow 45. In embodiments, the rotational axis of the outer vortex flow 45 is substantially parallel to the y-axis. FIG. 8 shows a perspective view of the outer vortex flow 45 according to embodiments of the present disclosure. As depicted, the outer vortex flow 45 has a hollow cylinder shape and has two flow regions: inner downward flow region 45-1 and an outer upward flow region 45-2. In embodiments, the inner vortex flow 43 is disposed in the middle hollow portion of the outer vortex flow 45 and surrounded by inner downward flow region 45-1. It is noted that the gas from the forward flow inlet 42 is mixed with the flow from the adaptor 44 to form the inner vortex flow 43. In embodiments, the outer vortex flow 45 surrounds the inner vortex flow 43, to thereby shield the inner wall 40 from the plasma 46.

In embodiments, as discussed above, the inner diameter of the plasma stabilizer 38 determines the radial dimension of the inner vortex flow 43. As such, in embodiments, the inner diameter of the plasma stabilizer 38 may be adjusted so that the outer vortex flow 45 surrounds the inner vortex flow 43 and maintain the flow regime of the inner vortex flow 43 in a stable manner to thereby stabilize the plasma and yield improved throughput and efficiency.

In embodiments, the plasma 46 is used to reform the inlet gas to the desired product gas, where the inlet gas is introduced into the plasma cavity by the forward flow inlet 42 and adaptor 44. In embodiments, the gas composition of the inner vortex flow exiting the forward flow inlet 42 includes $CO_2$, $CH_4$ and $O_2$, and the gas exiting the gas outlet 32 includes CO and $H_2$ as well as a non-reacted portion of forward flow gas. In embodiments, the preferred distribution for the forward flow is 5%-95% by mass of the total flow into the plasma chamber 22. In embodiments, the gas compositions and flow rates of the forward and reverse flows may be adjusted to enhance the plasma stability and efficiency of the chemical reaction in the plasma chamber 22.

Figure 9:
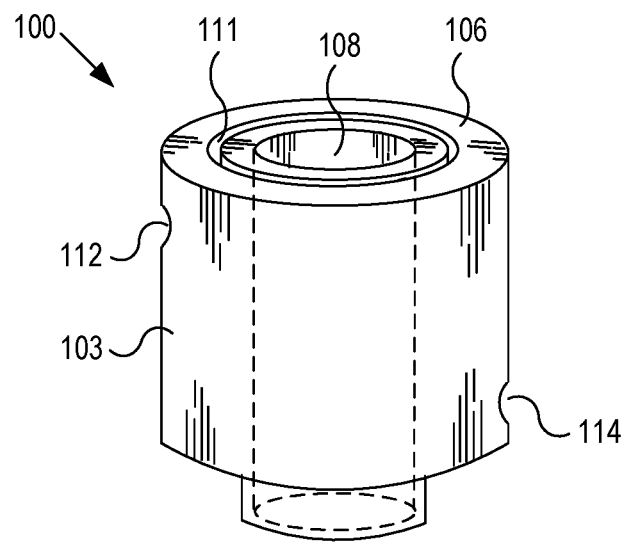
FIG. 9 shows a perspective view of a recuperator according to embodiments of the present disclosure.

In embodiments, the recuperator 100 recovers heat energy from the exhaust gas that exits the gas outlet 32 and transfers the heat energy to the inlet gas. FIG. 9 shows a perspective view of the recuperator 100 according to embodiments of the present disclosure. As depicted, the recuperator 100 is a gas container having an enclosed space/chamber 109 therein, and the wall of the recuperator 100 includes: an inner shell 102; outer shell 103; a top cap 106; a bottom cap 107; an opening (which is also referred to as "outlet") 111 formed in the top cap 106; and one or more fins/baffles 104 secured to the inner and outer shells and disposed in an enclosed space/chamber 109. In embodiments, the opening 111 is a ring-shaped slit, even though the opening 111 may have other suitable shape. In embodiments, the opening 82 in the adaptor 44 is aligned with the opening 111 formed in the top cap of the recuperator 100 so that the heated gas flows from the chamber 109 into the adaptor 44.

In embodiments, each of the inner and outer shells has a shape of a hollow circular cylinder, and each of the top and bottom caps has a shape of a ring-shaped disk, where the inner shell 102, outer shell 103, top cap 106, and the bottom cap 107 define the chamber 109. In embodiments, the recuperator 100 is preferably made of (but not limited to) a nickel alloy, such as a member of the Inconel family.

In embodiments, the inner shell 102 defines a gas passageway/hole 108 that is in fluid communication with the gas outlet 32 of the adaptor 44, where the exhaust gas flows through the gas passageway 108. In embodiments, the outer shell 103 includes an inlet hole/adaptor 114 for coupling to the gas line 28 and an outlet hole/adaptor 112 for coupling to the gas line 29.

In embodiments, the reacted/exhaust gas flowing through the gas passageway 108 is at elevated temperature, transferring heat energy to the recuperator 100. In embodiments, the recuperator 100 uses the transferred heat energy to heat the inlet gas from the gas tank 30 and the heated inlet gas enters the adaptor 44 and/or the forward flow inlet 42, to thereby improve the efficiency of the reaction being effected by the plasma 46. Also, the recuperator 100 extracts heat energy from the reacted/exhaust gas as the reacted/exhaust gas flows through the gas passageway 108, to thereby reduce the temperature of the exhaust gas below the melting point or service temperature of the recuperator material.

Figure 10A:
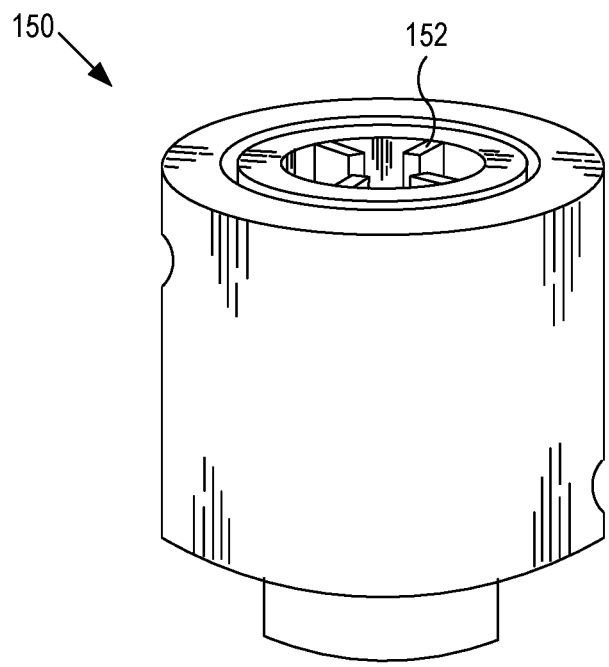
FIG. 10A shows a perspective view of a recuperator according to embodiments of the present disclosure.
Figure 10B:
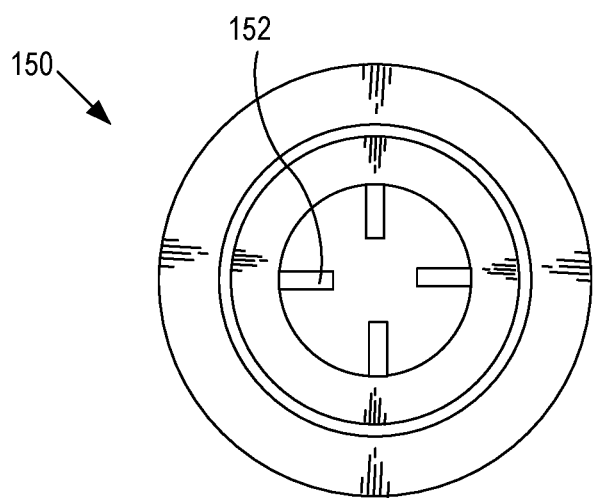
FIG. 10B shows a top view of the recuperator in FIG. 10A according to embodiments of the present disclosure.

In embodiments, the fins/baffles 104 are arranged so as to maximize the surface area and thermal transport without inducing excessive pressure drop. In embodiments, additional baffles may be disposed in the gas passageway 108. FIG. 10A shows a perspective view of a recuperator 150 according to embodiments of the present disclosure. FIG. 10B shows a top view of the recuperator 150 in FIG. 10A according to embodiments of the present disclosure. As depicted, one or more fins/baffles 152 are disposed parallel to gas flow so as to improve heat exchange without inducing excessive pressure drop.

Figure 10C:
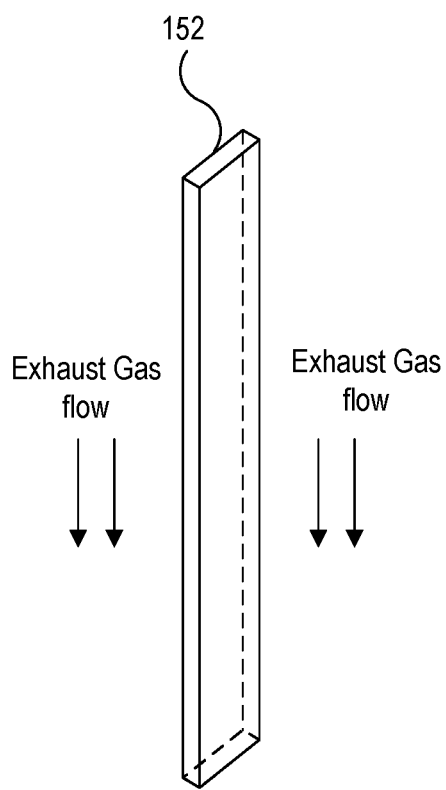
FIG. 10C shows a perspective view of a fin/baffle in FIG. 10A according to embodiments of the present disclosure.
Figure 11:
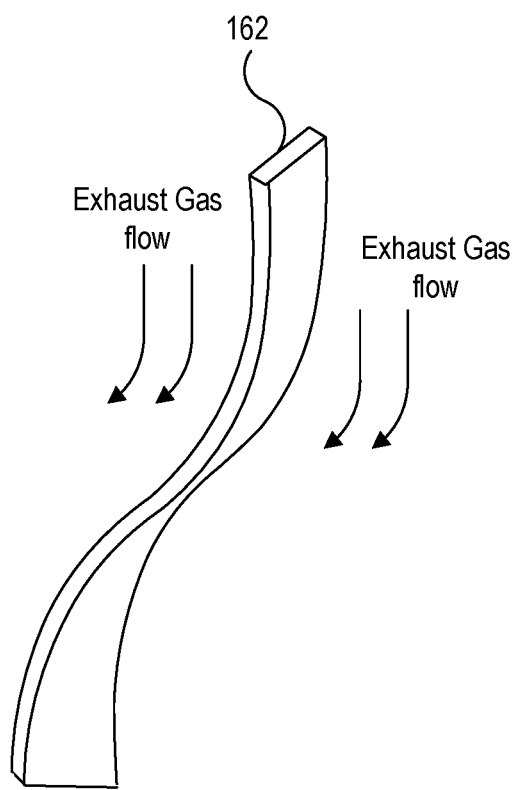
FIG. 11 shows a perspective view of a fin/baffle according to embodiments of the present disclosure.

FIG. 10C shows a perspective view of the fin/baffle 152 in FIG. 10A according to embodiments of the present disclosure. As depicted, the fin 152 has a shape of a rectangular plate and arranged substantially in parallel to the exhaust gas flow exiting the adaptor 44. In embodiments, the baffles 152 may be rifled in either handed-ness relative to the flow of gas through the gas passageway 108. FIG. 11 shows a perspective view of a fin/baffle 162 according to embodiments of the present disclosure. As depicted, the fin/baffle 162 is rifled/curved in relative to the exhaust gas flow so that the exhaust gas flow is deflected by the fin. In embodiments, the fin 162 may be used in place of the fin 152.

In embodiments, a portion of the heated inlet gas inside the chamber 109 enters the stagnation chamber 80 through both the opening 111 formed in the top cap 106 and the opening 82 formed on the bottom side of the adaptor 44. In embodiments, the remaining portion of the heated inlet gas inside the chamber 109 flows through the outlet hole/adaptor 112 and the gas line 29 and enters the forward flow inlet 42.

In alternative embodiments, a forward gas inlet 42 may receive the inlet gas from a separate gas tank that is similar to the gas tank 30, i.e., the gas line 29 may be directly coupled to a separate gas tank and the gas flowing into the forward gas inlet 42 may be at room temperature. In such configurations, the forward flow may have different gas composition from the reverse flow. Also, the gas composition of the forward flow (and/or reverse flow) may be changed during operation. For instance, the forward flow may include a slug of argon to aid ignition of the plasma 46. In embodiments, the gas compositions and flow rates of the forward and reverse flows may be adjusted to enhance the plasma stability and efficiency of the chemical reaction in the plasma chamber 22.

Figure 12:
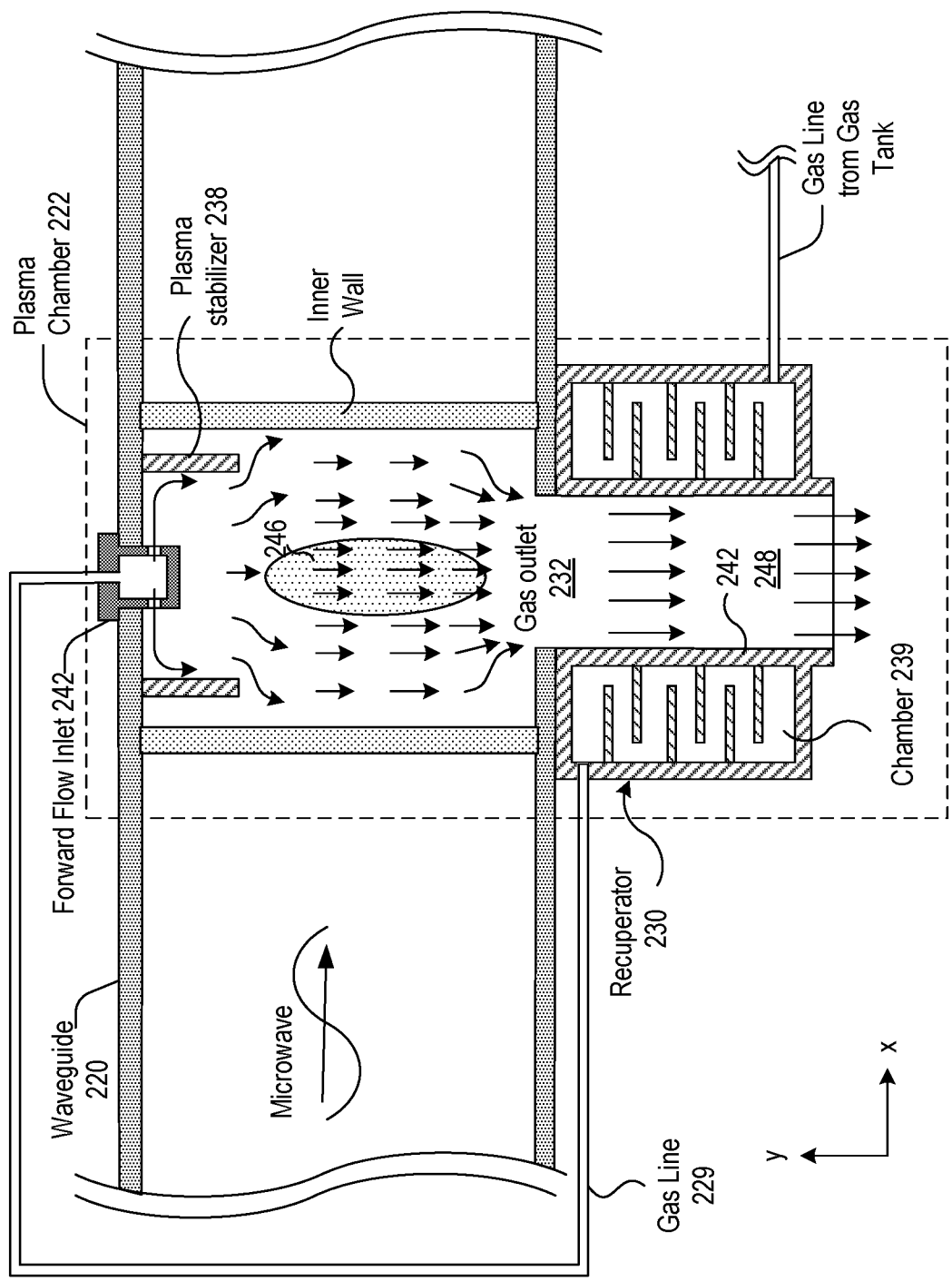
FIG. 12 shows a cross sectional view of a plasma chamber in FIG. 1, taken along the line 2-2, according to embodiments of the present disclosure.
Figure 13:
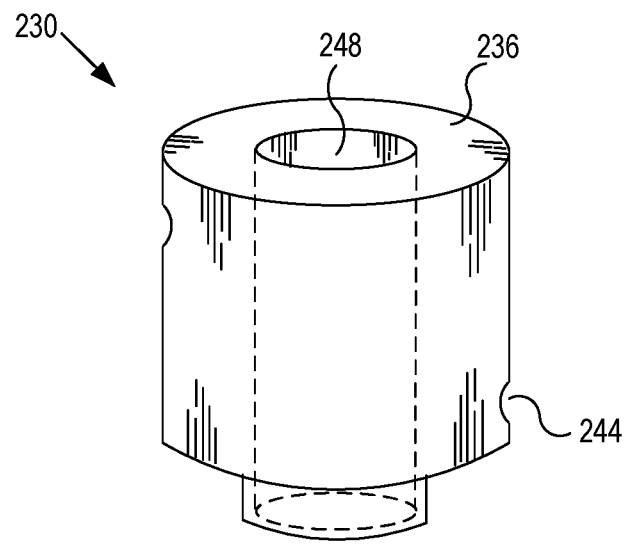
FIG. 13 shows a perspective view of a recuperator according to embodiments of the present disclosure.

FIG. 12 shows a cross sectional view of a plasma chamber in FIG. 1, taken along the line 2-2, according to embodiments of the present disclosure. FIG. 13 shows a perspective view of a recuperator 230 according to embodiments of the present disclosure. As depicted, the plasma chamber 222 is similar to the plasma chamber 22 in FIG. 2, with the difference that the plasma chamber 222 does not have the reverse flow inlet (adaptor). In embodiments, the waveguide 220 has a gas outlet 232 through which the gas processed/reacted by the plasma 246 exits the plasma cavity. It is noted that the plasma chamber 222 does not generate the outer vortex flow that is similar to the outer vortex flow 45.

In embodiments, the recuperator 230 is directly attached to the waveguide 220 and the inner shell 242 of the recuperator 230 defines a hole 248 that is in fluid communication with the gas outlet 232 formed in the wall of the waveguide 220. In embodiments, the recuperator 230 recovers the heat energy from the exhaust gas flowing through the hole 248 and the uses the heat energy to heat the gas in the chamber 239 before the gas in the chamber 239 is transferred to the forward gas inlet 242 via the gas line 229.

In embodiments, the recuperator 230 is similar to the recuperator 100 in FIG. 9, with the difference that the top cap 236 of the recuperator 230 does not have any ring-shaped slit for providing gas to the plasma cavity. It is noted that the components of the plasma chamber 222 are formed of similar materials as their counterparts of the plasma chamber 222. It is also noted that plasma stabilizer 238 is an optional component.

Figure 14:
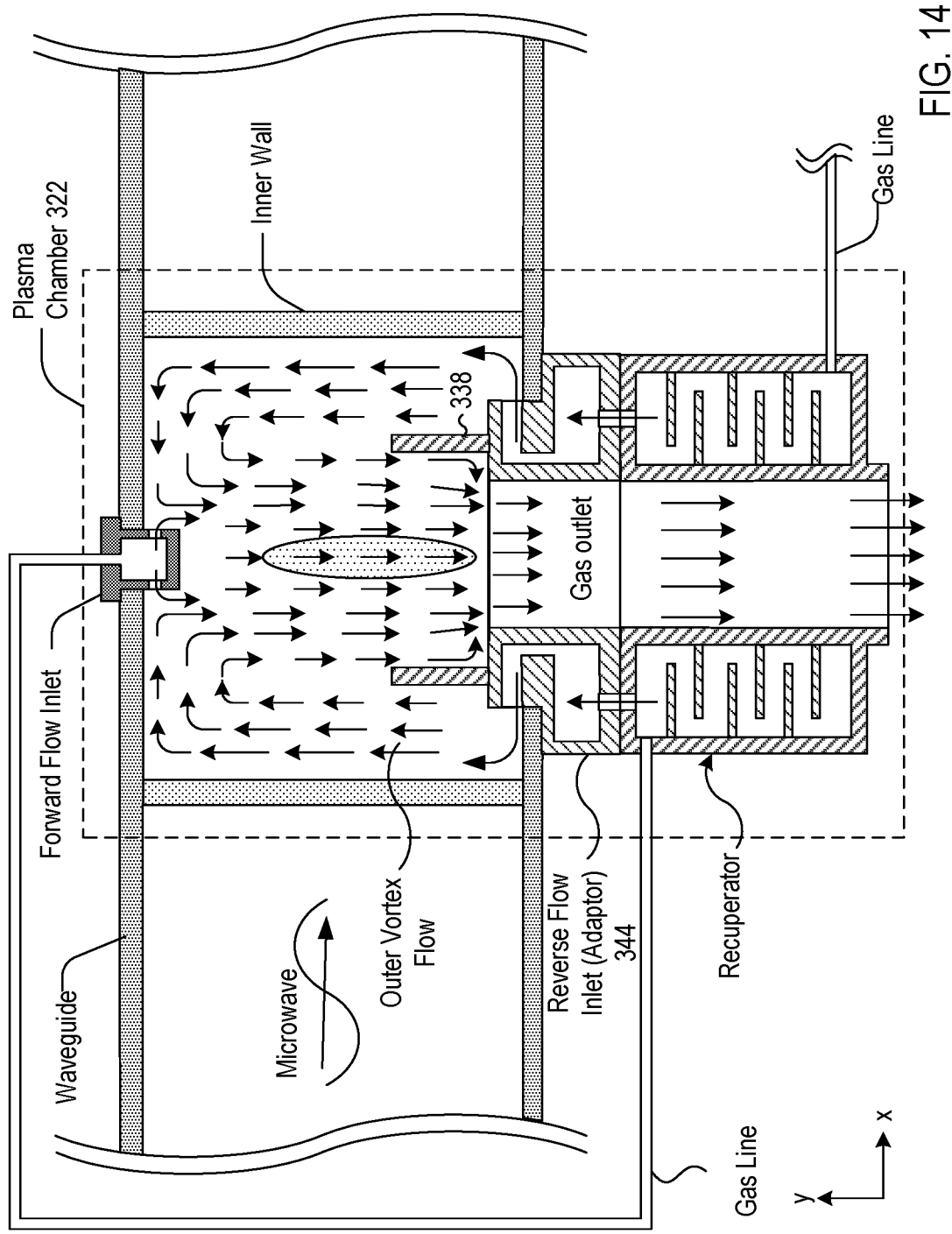
FIG. 14 shows a cross sectional view of a plasma chamber in FIG. 1, taken along the line 2-2, according to embodiments of the present disclosure.

FIG. 14 shows a cross sectional view of a plasma chamber in FIG. 1, taken along the line 2-2, according to embodiments of the present disclosure. As depicted, the plasma chamber 322 is similar to the plasma chamber 22 with the difference that the plasma stabilizer 338 is disposed on the reverse flow inlet (which is also referred to as "adaptor") 344. It is noted that the plasma chamber 322 is one of the various embodiments of the plasma chamber 22 in FIG. 1. The description of other exemplary embodiments of the plasma chamber can be found in a copending U.S. Patent Application Ser. No. 16/752,689, entitled "Plasma reactor for processing gas," filed on Jan. 26, 2020, which is hereby incorporated by reference in its entirety.

Figure 16:
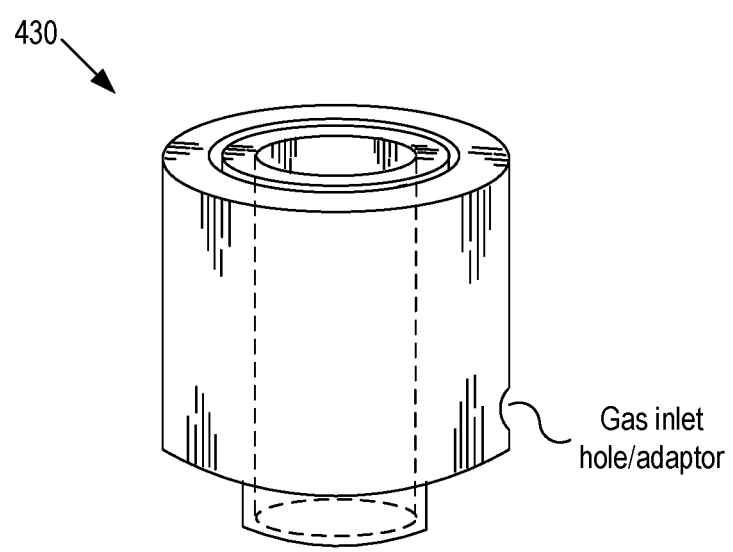
FIG. 16 shows a perspective view of a recuperator according to embodiments of the present disclosure.
Figure 15:
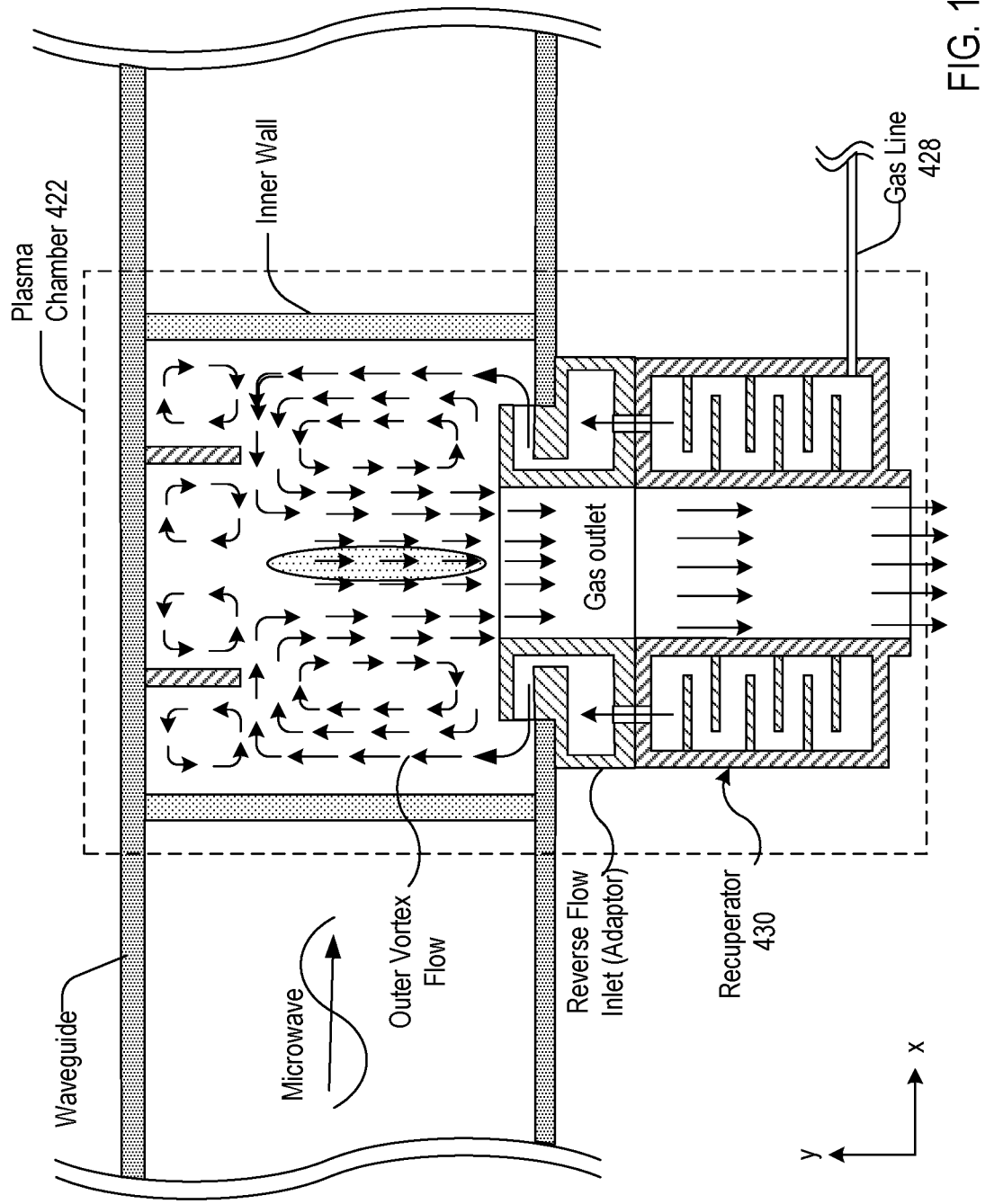
FIG. 15 shows a cross sectional view of a plasma chamber in FIG. 1, taken along the line 2-2, according to embodiments of the present disclosure.

FIG. 15 shows a cross sectional view of a plasma chamber in FIG. 1, taken along the line 2-2, according to embodiments of the present disclosure. As depicted, the plasma chamber 422 is similar to the plasma chamber 22, with the difference that the plasma chamber 422 does not have the forward flow inlet as well as the gas line 29 for providing the heated inlet gas for the forward flow inlet. As such, the plasma chamber 422 does not generate an inner vortex flow that is similar to the inner vortex flow 43. FIG. 16 shows a perspective view of the recuperator 430 in FIG. 15 according to embodiments of the present disclosure. In embodiments, compared to the recuperator 100 in FIG. 9, the recuperator 430 does not have the gas outlet hole/adaptor 112 for connecting to the gas line 29.

It is noted that the recuperators 230 and 430 may have addition fins/baffles that are similar to the fins/baffles 152 (or 162) in the recuperator 100, i.e., each of the recuperators 230 and 430 may include fins/baffles disposed in the hole through which the reacted/exhaust gas flows.

As discussed above in conjunction with FIG. 2, that the recuperator 100 is detachably secured to the adaptor 44 by a suitable fastening mechanism, such as screw (not shown in FIG. 2). In alternative embodiments, the recuperator is not secured to the adaptor; instead, the recuperator 100 and adaptor 44 are formed as one monolithic body. Similarly, in alternative embodiments, the recuperator and adaptor in FIG. 14 (or FIG. 15) may be formed as one monolithic body.

It is noted that the recuperators in FIGS. 1-16 are directly attached to the adaptors or waveguides, i.e., the recuperators are directly secured to or integrated into the same body as plasma chamber, minimizing the use of expensive material and/or material that is difficult to work with. Also, in embodiments, the exhaust and inlet gases are arranged such that the inlet gas in the recuperator acts to cool the recuperator body, preventing the material of the recuperator body from melting or exceeding its recommended service temperature and that the exhaust gas does not excessively impinge on the recuperator body to thereby prevent the temperature of the recuperator body from exceeding the service temperature of the recuperator.

In embodiments, the plasma chambers in FIGS. 1-16 eliminate the need for conventional tubing, bent and straight, that is normally required to implement a physically separate reactor and recuperator. This conventional tubing would need to withstand the thermal and chemical nature of the exhaust gas, potentially oxidizing, which is at best impractical and expensive to achieve with exotic coatings on refractory metals or materials. Furthermore, all heat losses and insulation requirements associated with the conventional tubing or piping to connect a reactor to a recuperator are eliminated in whole, resulting in an increase to the recoverable heat.

In embodiments, the plasma chambers in FIGS. 1-16 lack the conventional necessary tubing, piping, and/or fittings, allowing for operation in a smaller geometric footprint to an otherwise equivalent recuperator and reactor in the conventional systems. The compactness of the plasma chambers in FIGS. 1-16 is of considerable importance where arrays of plasma reactors with integrated recuperators are packaged tightly so as to process increased amounts of inlet gas.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A plasma generating system, comprising:
   a plasma cavity for generating a plasma therewithin;
   an adaptor having a gas outlet through which an exhaust gas processed by the plasma exits the plasma cavity; and
   a recuperator directly attached to the adaptor and having a gas passageway that is in fluid communication with the gas outlet in the adaptor, the recuperator being configured to recover heat energy from the exhaust gas and to heat an input gas using the heat energy, where the input gas heated by the recuperator is input to the plasma cavity,
   wherein the recuperator has an enclosed space thereinside, a gas inlet through which the input gas flows into the enclosed space and a gas outlet through which the input gas heated using the heat energy exits the enclosed space.

2. A plasma generating system as recited in claim 1, wherein the recuperator has an enclosed space thereinside and one or more baffles that are disposed inside the enclosed space and transfer heat energy to the input gas.

3. A plasma generating system as recited in claim 1, wherein the recuperator has one or more baffles that are disposed in the gas passageway and wherein the one or more baffles recover heat energy from the exhaust gas.

4. A plasma generating system as recited in claim 3, wherein each of the one or more baffles is arranged in parallel to a flow direction of the exhaust gas exiting the gas outlet.

5. A plasma generating system as recited in claim 3, wherein each of the one or more baffles is rifled relative to a flow direction of the exhaust gas exiting the gas outlet.

6. A plasma generating system as recited in claim 1, wherein the recuperator has a cap that is in direct contact with a bottom wall of the adaptor and the gas outlet of the recuperator is formed in the cap and wherein the bottom wall of the adaptor has a gas inlet and wherein the gas outlet of the recuperator is aligned with the gas inlet of the adaptor so that the input gas heated in the enclosed space flows into the adaptor through gas outlet of the recuperator and the gas inlet of the adaptor.

7. A plasma generating system as recited in claim 1, further comprising:
   a flow inlet configured to introduce the input gas heated by the recuperator into the plasma cavity; and
   a pipe having one end coupled to the gas outlet of the recuperator and an other end to the flow inlet, wherein the input gas heated by the recuperator passes through the pipe.

8. A plasma generating system as recited in claim 7, further comprising:
   a waveguide for transmitting a microwave energy therethrough; and
   an inner wall disposed within the waveguide to define the plasma cavity, a plasma being generated within the plasma cavity using the microwave energy,
   wherein the adaptor is mounted on a bottom side of the waveguide and the flow inlet is mounted on a top side of the waveguide.

9. A plasma generating system as recited in claim 7, wherein the flow inlet introduces the input gas as a vortex flow into the plasma cavity.

10. A plasma generating system as recited in claim 7, further comprising:
    a plasma stabilizer having a shape of a circular hollow cylinder and protruding into the plasma cavity, wherein a portion of the flow inlet is disposed inside the plasma stabilizer.

11. A plasma generating system as recited in claim 1, wherein the adaptor is configured to generate a vortex flow within the plasma cavity using the input gas heated by the recuperator.

12. A plasma generating system as recited in claim 11, further comprising:
    a plasma stabilizer having a shape of a circular hollow cylinder and disposed on the adaptor,
    wherein a longitudinal direction of the plasma stabilizer is parallel to a rotational axis of the vortex flow.

13. A plasma generating system as recited in claim 1, wherein the adaptor and the recuperator are formed as one monolithic body.

14. A plasma generating system, comprising:
    a waveguide for transmitting a microwave energy therethrough;
    an inner wall disposed within the waveguide to define a plasma cavity, a plasma being generated within the plasma cavity using the microwave energy, the waveguide having a gas outlet through which an exhaust gas processed by the plasma exits the plasma cavity;
    a recuperator directly attached to the waveguide and having a gas passageway that is in fluid communication with the gas outlet in the waveguide, the recuperator being configured to recover heat energy from the exhaust gas and to heat an input gas using the heat energy;
    a gas inlet mounted on the waveguide and configured to receive the input gas from the recuperator and introduce the input gas into the plasma cavity; and
    a pipe having one end coupled to the recuperator and an other end coupled to the gas inlet, wherein the input gas flows from the recuperator to the gas inlet through the pipe.

15. A plasma generating system as recited in claim 14, wherein the recuperator has an enclosed space thereinside and one or more baffles disposed inside the enclosed space and wherein heat energy is transferred from the one or more baffles to the inlet gas.

16. A plasma generating system as recited in claim 14, wherein the recuperator has one or more baffles that are disposed in the gas passageway and wherein the one or more baffles recover heat energy from the exhaust gas.

17. A plasma generating system as recited in claim 14, wherein each of the one or more baffles is arranged in parallel to a flow direction of the exhaust gas exiting the gas outlet.

18. A plasma generating system as recited in claim 14, wherein each of the one or more baffles is rifled relative to a flow direction of the exhaust gas exiting the gas outlet.

19. A plasma generating system as recited in claim 14, wherein the gas inlet is configured to introduce the input gas into the plasma cavity as a vortex flow.

20. A plasma generating system as recited in claim 14, further comprising:
    a plasma stabilizer having a shape of a circular hollow cylinder and protruding into the plasma cavity, wherein as portion of the gas inlet is disposed inside the plasma stabilizer.

* * * * *